United States Patent
Guo et al.

(10) Patent No.: US 10,103,742 B1
(45) Date of Patent: Oct. 16, 2018

(54) MULTI-STAGE HYBRID ANALOG-TO-DIGITAL CONVERTER

(71) Applicant: Hong Kong Applied Science and Technology Research Institute Company, Limited, Hong Kong (HK)

(72) Inventors: Huimin Guo, Hong Kong (HK); Lu Chen, Hong Kong (HK); Kam Chuen Wan, Hong Kong (HK)

(73) Assignee: Hong Kong Applied Science and Technology Research Institute Company, Limited, Hong Kong (HK)

( * ) Notice: Subject to any disclaimer, the term of this patent is extended or adjusted under 35 U.S.C. 154(b) by 0 days.

(21) Appl. No.: 15/878,375

(22) Filed: Jan. 23, 2018

(51) Int. Cl.
H03M 1/14 (2006.01)
H03M 1/16 (2006.01)
H03M 1/46 (2006.01)
H03M 1/68 (2006.01)

(52) U.S. Cl.
CPC .......... H03M 1/145 (2013.01); H03M 1/16 (2013.01); H03M 1/462 (2013.01); H03M 1/466 (2013.01); H03M 1/68 (2013.01)

(58) Field of Classification Search
None
See application file for complete search history.

(56) References Cited

U.S. PATENT DOCUMENTS

| | | | |
|---|---|---|---|
| 6,879,277 B1 * | 4/2005 | Cai | H03M 1/164 341/155 |
| 6,987,477 B1 | 1/2006 | Aude | |
| 8,416,107 B1 | 4/2013 | Wan et al. | |
| 8,466,823 B2 | 6/2013 | Chio et al. | |
| 8,643,529 B2 | 2/2014 | Lin | |
| 9,030,344 B2 * | 5/2015 | Chen | H03M 1/187 341/155 |

(Continued)

OTHER PUBLICATIONS

Jeon, Young-Deuk et al., A Dual-Channel Pipelined ADC With Sub-ADC Based on Flash-SAR Architecture, IEEE Transactions on Circuits and Systems—II: Express Briefs, Vol. 59, No. 11, Nov. 2012.*

(Continued)

*Primary Examiner* — Howard Williams
(74) *Attorney, Agent, or Firm* — gPatent LLC; Stuart T. Auvinen

(57) ABSTRACT

A hybrid Analog-to-Digital Converter (ADC) has multiple stages. A first stage and a final stage each use a Successive-Approximation Register (SAR) ADC to generate the Most-Significant-Bits (MSBs) and the Least-Significant-Bits (LSBs) over successive internal cycles. Middle stage(s) use a faster flash ADC with multiple comparators in parallel to generate the middle binary bits, which are then re-converted by a Digital-to-Analog Converter (DAC) and subtracted from the stage's input analog voltage to generate a difference that is amplified by a residual amplifier that outputs an amplified voltage to the next stage. The first stage also has this multiplying DAC structure to convert the MSBs to an amplified voltage to the first of the middle stages. Finally, digital error correction logic removes redundant binary bits between stages. Initial and final SAR stages of 4 and 8 bits with a 4-bit middle stage provide a hybrid ADC of 14-bit precision.

20 Claims, 10 Drawing Sheets

(56) References Cited

U.S. PATENT DOCUMENTS 9,705,520 B1 7/2017 Kumar et al.
2011/0001647 A1 1/2011 Veeder et al.

OTHER PUBLICATIONS

Park et al., " 12b 100 MS/s Three-step hybrid pipeline ADC based on time-interleaved SAR ADCs", Journal of semiconductor technology and science, vol. 14 No. 2, Apr. 2014.
Mok et al., "A novel architecture of comparator-mismatch-free multi-bit pipeline ADC", RIUPEEEC 2006.
Maxim Integrated, "Understanding Pipelined ADCs", Application notes Tutorial 1023, Oct. 2, 2001.

* cited by examiner

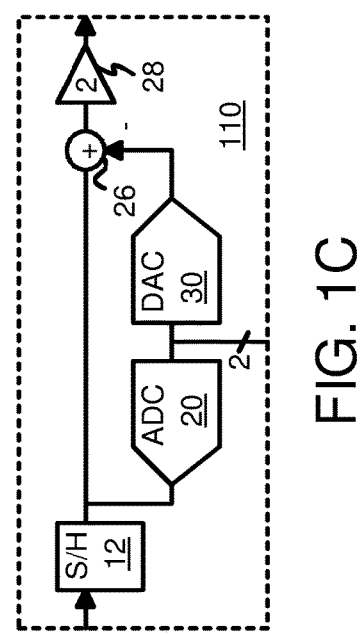
FIG. 1B PIPELINE ADC
FIG. 1C
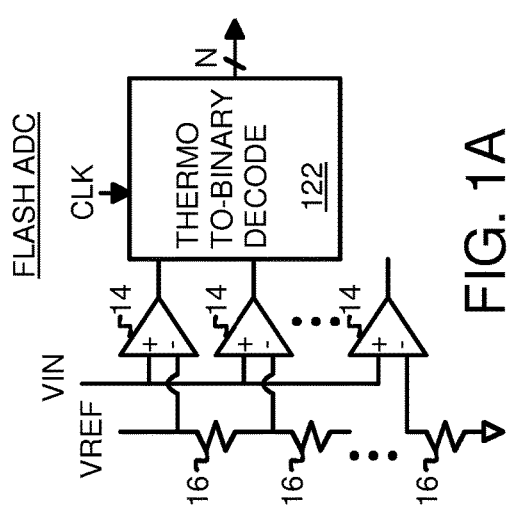
FIG. 1A FLASH ADC
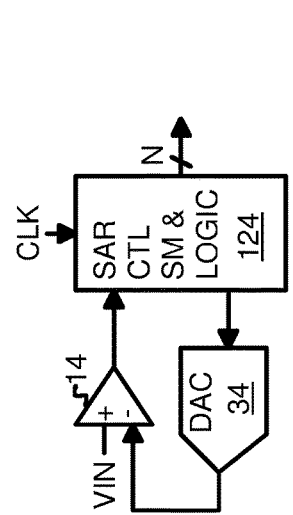
FIG. 1D SAR ADC
PRIOR ART

US 10,103,742 B1

MULTI-STAGE HYBRID ANALOG-TO-DIGITAL CONVERTER

FIELD OF THE INVENTION

This invention relates to a pipelined analog-to-digital converter (ADC), and more particularly to hybrid ADC's with both a flash-ADC stage and Successive-Approximation Register (SAR) Analog-to-Digital Converter (ADC) stages.

BACKGROUND OF THE INVENTION

Many applications such as portable telecommunication, imaging, and video systems use Analog-to-Digital Converters (ADC's). These applications often require an ADC with 10 bits or more of resolution. In addition to a high resolution, low power and high speed are also desirable.

FIGS. 1A-1D show various kinds of Analog-to-Digital Converters (ADC's) that have been used in a variety of applications. In FIG. 1A, a Flash ADC uses many comparators 14 in parallel to compare an analog input voltage VIN to various voltages generated by applying a reference voltage VREF to a voltage divider or resistors 16 in series. Decoder 122 converts the thermometer code from comparators 14 to an N-bit binary value. The flash ADC is fast, but requires a large area due to the parallel comparators 14, which also draw a large amount of power. Also, the flash ADC may require a separate sample-and-hold circuit (not shown) since it may not store signals.

In FIG. 1B, a pipeline ADC has several stages 110, 110', 110". Each stage generates a few bits such as 2 binary bits. FIG. 1C shows that a stage 110 has a sample and hold 12, an ADC 20 that converts the analog voltage to a 2-bit digital value, which is then converted back to analog by Digital-to-Analog Converter (DAC) 30 and subtracted from the sampled analog voltage by analog subtractor 26. The remaining voltage difference or residual voltage is amplified by amplifier 28 and applied as the analog voltage input to the next stage.

ADC 20 can be a small flash ADC such as a sigma-delta modulator, a small Successive-Approximation Register (SAR), or a 2-bit flash ADC. Since ADC 20 has only 2 bits and 2 comparators, power, cost, and area are reduced compared with the many parallel comparisons of the larger flash ADC of FIG. 1A. However, amplifier 28 must be very accurate and have a high performance, causing the power dissipation to increase.

FIG. 1D shows a SAR ADC. SAR state machine and control logic 124 includes an N-bit register that is adjusted every clock cycle until the correct result is obtained. The current digital value in the SAR is applied to DAC 34 and converted to an analog voltage that is compared to the input analog voltage by comparator 14. The result of comparator 14 is used to adjust the digital SAR value in SAR state machine and control logic 124. In each successive cycle, a next lower-significant binary bit can be tested. In general, the number of clock cycles required is equal to the number of binary bits. A SAR ADC is very efficient in power, area, and cost, but is complex to operate and has speed and resolution limitations due to the serial nature of its processing and accumulated comparator noise.

Each of the ADC architectures has drawbacks. The flash ADC is fast but has a lower resolution and requires high power and area. The pipeline ADC is not as fast as the flash ADC, but has a high resolution while being complex and relatively inefficient. The SAR ADC is very efficient in area and power, but is slow and limited to a moderate resolution.

What is desired is a hybrid ADC architecture that is fast and has a high resolution while still being efficient. A hybrid ADC with multiple stages is desired that uses a smaller flash ADC for speed, but also uses a SAR for efficiency. A pipelined hybrid SAR and flash ADC is desirable.

BRIEF DESCRIPTION OF THE DRAWINGS

FIGS. 1A-1D show various kinds of Analog-to-Digital Converters (ADC's) that have been used in a variety of applications.

DETAILED DESCRIPTION

The present invention relates to an improvement in a multi-stage hybrid ADC. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 2:
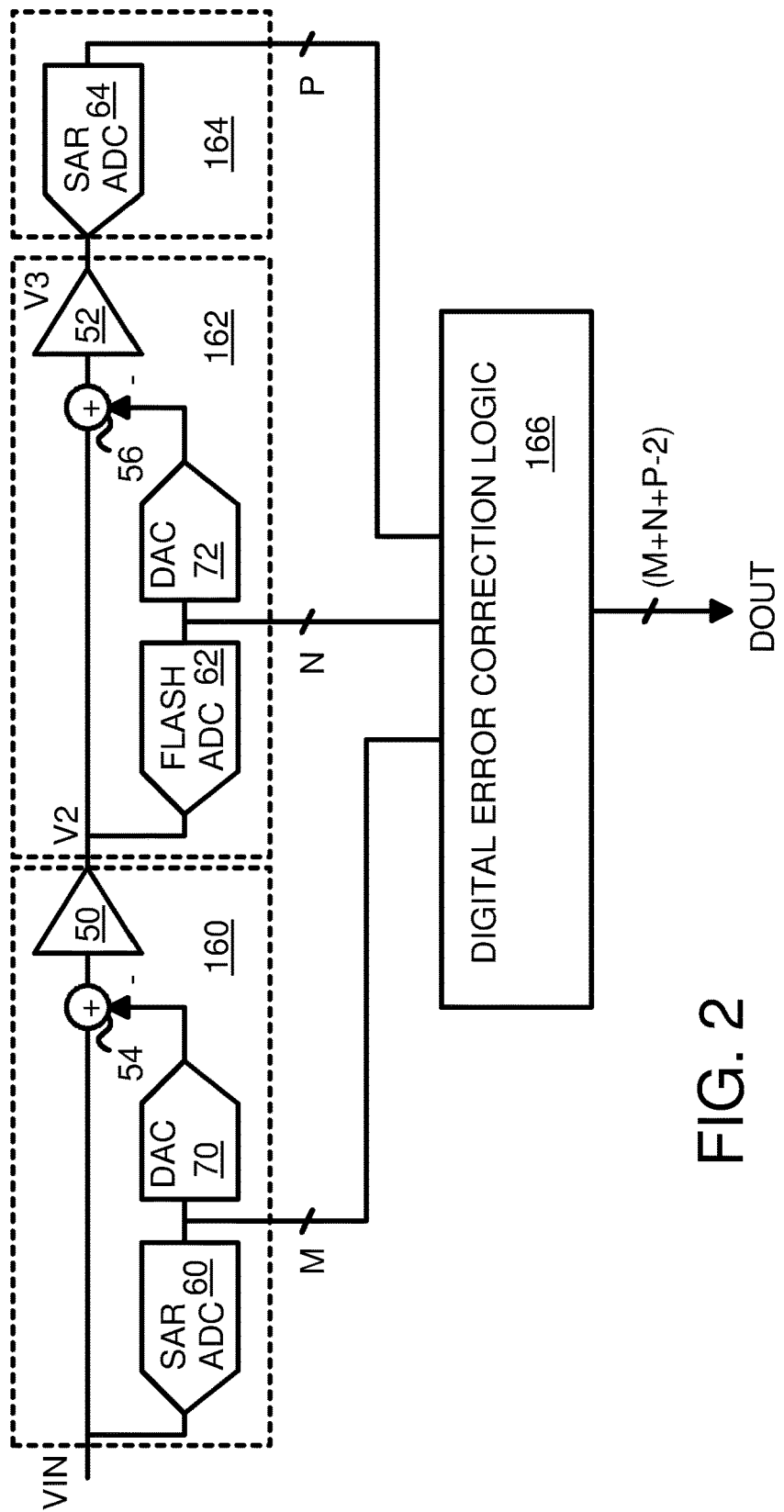
FIG. 2 is a block diagram of a multi-stage hybrid ADC with flash and SAR stages.

FIG. 2 is a block diagram of a multi-stage hybrid ADC with flash and SAR stages. Three stages 160, 162, 164, are used to provide a high resolution, such as 14 bits. SAR first stage 160 includes SAR ADC 60 that converts input analog voltage VIN over several clock cycles. Flash second stage 162 uses flash ADC 62 to quickly convert the analog voltage output from SAR first stage 160. SAR final stage 164 includes SAR ADC 64 that generates a final set of P digital bits over several successive clock cycles.

SAR is power and area efficient but slow, while flash is fast but expensive in area and power. Flash ADC is used in the middle stage, where the inventors believe that the timing is more critical. Speed is improved by using flash in the middle stage, and more efficient SAR at the terminal stages. Using SAR for the first and last stages provides sample and hold functionality so that separate sample and hold circuits are not needed.

SAR first stage 160 uses SAR ADC 60 to convert input analog voltage VIN to M binary bits. These M bits are the Most-Significant-Bits (MSBs). DAC 70 re-converts the M binary bits back to an analog voltage that is subtracted from VIN by subtractor 54. The difference voltage or residual is then amplified by residual amplifier 50 to drive V2 to the second stage.

DAC 70, subtractor 54, and residual amplifier 50 form a multiplying DAC, since the residual voltage is amplified to a larger voltage V2 that is input to the next stage. Amplifying the residual voltage allows the subsequent stage to use smaller, less precise components than would be necessary is a small, un-amplified input voltage were used.

Flash second stage 162 uses flash ADC 62 to convert amplified voltage V2 from SAR first stage 160 to N binary bits. DAC 72 then re-converts these N binary bits to an analog voltage that is subtracted from V2 by subtractor 56 to generate a second residual voltage that is amplified by residual amplifier 52 to generate voltage V3. DAC 72, subtractor 56, and residual amplifier 52 form a second multiplying DAC, since the second residual voltage is amplified to a larger voltage V3 that is input to the next stage.

SAR final stage 164 uses SAR ADC 64 to convert voltage V3 to the final P binary bits. These P bits are the Least-Significant-Bits (LSBs).

The last of the M bits from SAR first stage 160 and the first of the N bits from flash second stage 162 can also overlap and be added together to form one bit. Also, the last of the N bits from flash second stage 162 and the first of the P bits from SAR final stage 164 can also overlap and be added together for to form one bit. Digital error correction logic 166 may include full adders and D-type latches to add the input bits to generate the output bits with redundant bits between stages removed.

The final output from digital error correction logic 166 is the converted digital value, digital output DOUT. DOUT has M+N+P−2 binary bits, with M being the MSB's and P being the LSB's.

The values of M, N, and P can be optimized in a variety of ways. For example, M,N,P of 6,3,7 uses a 6-bit SAR in SAR first stage 160 and a 7-bit SAR in SAR final stage 164, while only 3 bits in flash second stage 162. The SAR stages each use only 1 comparator, resulting in low power and area while providing a high resolution. Having only 3 bits in flash second stage 162 requires a relatively small flash ADC with few comparators (eight), but providing fast conversion.

Having a large number of bits converted by SAR first stage 160 relaxes the linearity requirement of succeeding amplifiers such as residual amplifier 50. A large front-end sample-and-hold circuit is not needed since the capacitor array in SAR ADC 60 can hold charge, acting as a sample-and-hold.

The capacitor array matching requirement of SAR final stage 164 is easy to meet for 9 or 10-bit resolutions using current fabrication processes.

For a smaller size and power, it is preferred to have M and P be larger than N, so that more bits are converted by SAR and fewer bits are converted by flash ADC.

Figure 3:
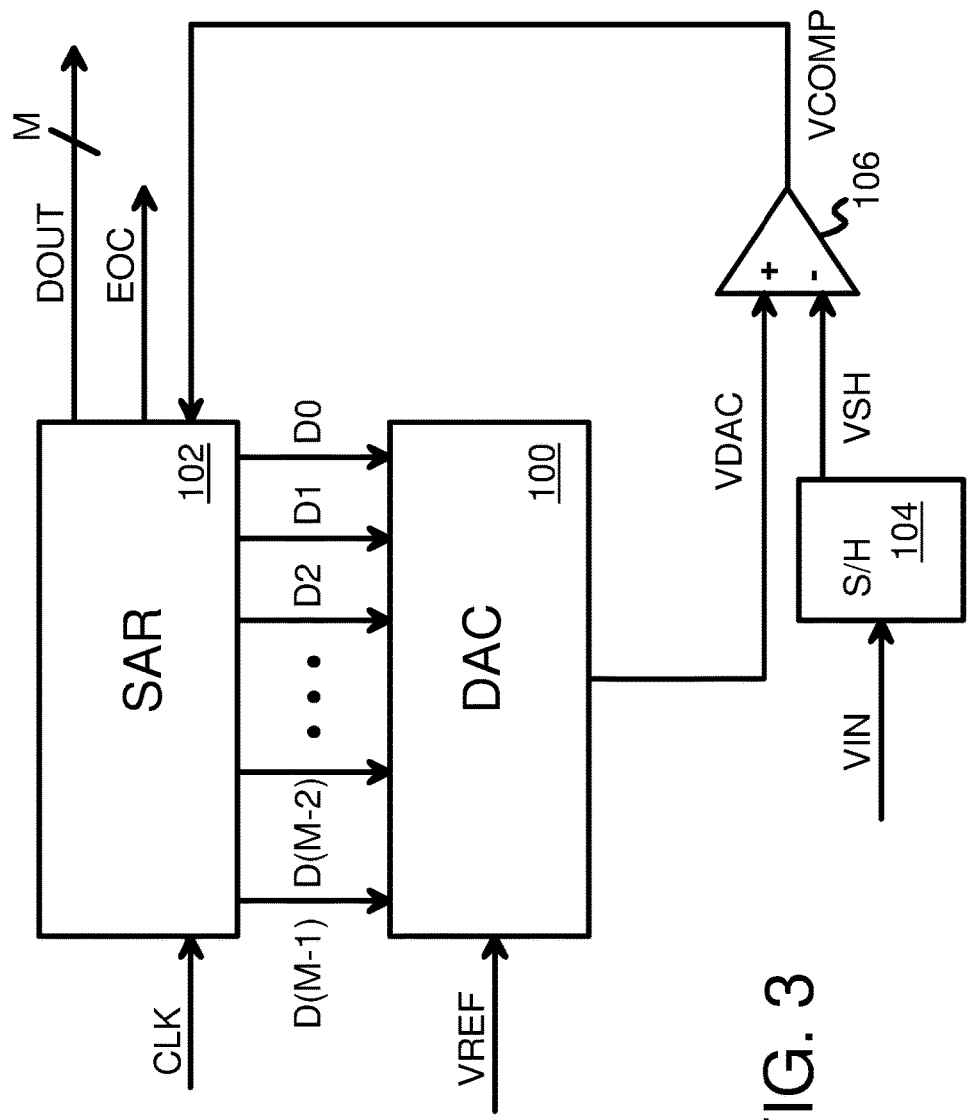
FIG. 3 shows a Successive-Approximation-Register ADC.

FIG. 3 shows a Successive-Approximation-Register ADC. SAR ADC 60 in SAR first stage 160 and SAR ADC 64 in SAR final stage 164 (FIG. 2) can be a SAR ADC such as shown in FIG. 3.

Successive-Approximation-Register SAR 102 receives a clock CLK and contains a register value that is changed to gradually zero-in on a close approximation of the analog input voltage VIN. For example, the value in SAR 102 may first be 0.5, then 0.25, then 0.375, then 0.313, then 0.281, then 0.296, then 0.304, then 0.308, then 0.31, then 0.311, and finally 0.312 when comparing to a VIN of 0.312 volts. SAR 102 outputs the current register value to digital-to-analog converter (DAC) 100, which receives a reference voltage VREF and converts the register value to an analog voltage VDAC.

The input analog voltage VIN is applied to sample-and-hold circuit 104, which samples and holds the value of VIN. For example, a capacitor can be charged by VIN and then the capacitor isolated from VIN to hold the analog voltage. The sampled input voltage from sample-and-hold circuit 104 is applied to the inverting input of comparator 106. The converted analog voltage VDAC is applied to the non-inverting input of comparator 106.

Comparator 106 compares the converted analog voltage VDAC to the sampled input voltage and generates a high output VCOMP when the converted analog voltage VDAC is above the sampled VIN, and the register value in SAR 102 is too high. The register value in SAR 102 can then be reduced.

When the converted analog voltage VDAC is below the sampled input voltage, comparator 106 generates a low output VCOMP to SAR 102. The register value in SAR 102 is too low. The register value in SAR 102 can then be increased for the next cycle.

The register value from SAR 102 is a binary value of M bits, with D(M−1) being the MSB and D0 being the LSB. SAR 102 can first set the MSB D(M−1), then compare the converted analog voltage VDAC to the input voltage VIN, then adjust the MSB and/or set the next MSB D(M−2) based on the comparison. The set and compare cycle repeats until after M cycles the LSB is set. After the last cycle, the end-of-cycle EOC signal is activated to signal completion. A state machine or other controller can be used with or included inside SAR 102 to control sequencing.

Figure 4:
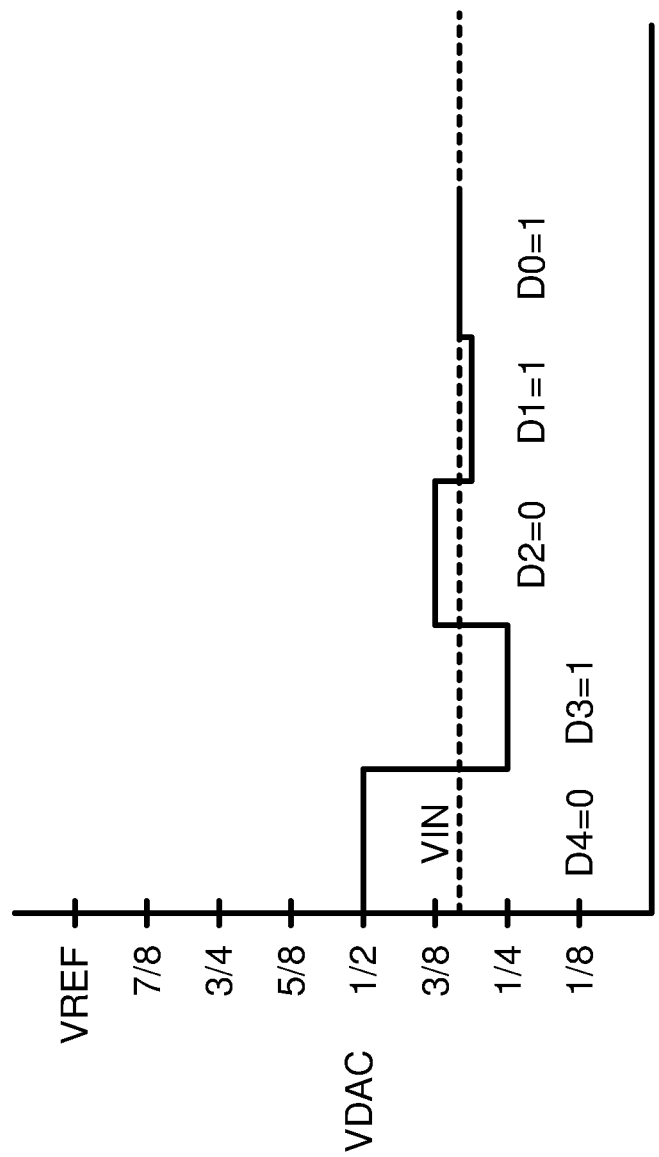
FIG. 4 is a graph showing a SAR ADC resolving an input voltage.

FIG. 4 is a graph showing a SAR ADC resolving an input voltage. The register value in SAR 102 is initially set to one-half, or 10000. Comparator 106 determines that the input voltage VIN is less than the converted value from SAR 102, so in the next iteration SAR 102 is set to one-quarter, or 01000. Comparator 106 determines that the input voltage VIN is greater than the converted value from SAR 102, so in the third iteration SAR 102 is set to three-eighths, or 01100. Comparator 106 determines that the input voltage VIN is less than the converted value from SAR 102 in the third iteration, so in the fourth iteration SAR 102 is set to five-sixteenths, or 01010. Now comparator 106 determines that the input voltage VIN is greater than the converted value from SAR 102, so in the fifth iteration SAR 102 is set to 9/32, or 01011. The final comparison is that VIN is above the converted value, so the final result is 01011.

While a SAR-DAC is useful, a relatively large amount of time is required to obtain the digital output data bits. Approximately one clock cycle is required for each binary bit. Thus a 4-bit SAR-DAC ADC would require 4 clock cycles, while an 8-bit SAR-DAC ADC would require 8 clock cycles.

Figure 5:
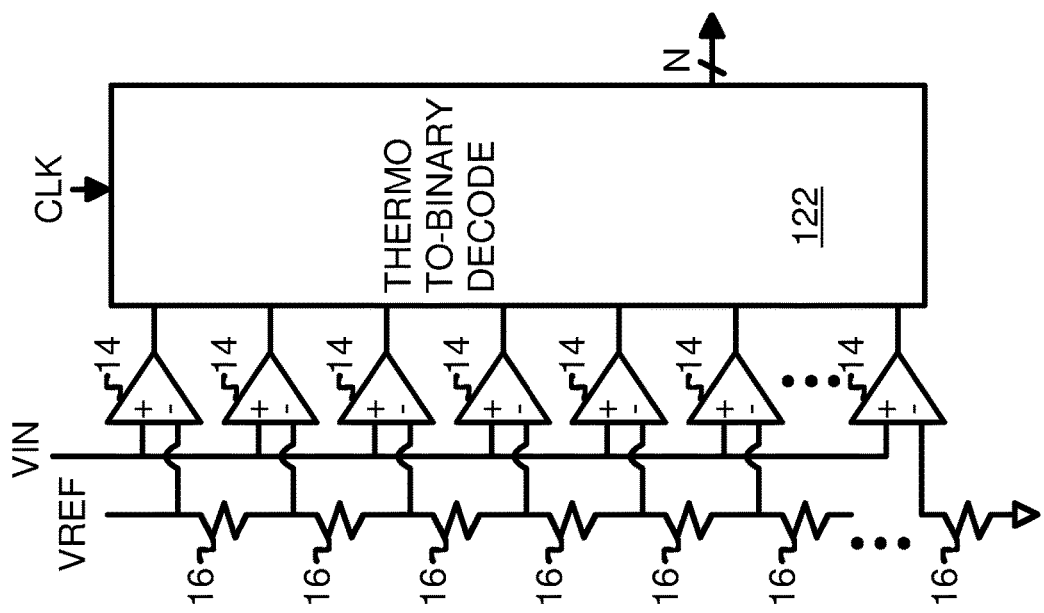
FIG. 5 shows a flash ADC.

FIG. 5 shows a flash ADC. In contrast to the slow SARDAC ADC of FIGS. 3-4 that requires several clock cycles, a flash ADC generates all binary bits in the same clock cycle.

The flash ADC performs voltage comparisons in parallel, using comparators 14 to compare input voltage VIN to a series of divided reference voltages that are generated by a voltage divider of resistors 16 that divide reference voltage VREF into many segments that are each input to one of comparators 14. The output of comparators 14 will be high for all comparators having their segmented reference voltage being less than VIN, and low for the other comparators having their segmented reference voltages greater than VIN. The outputs of comparators will be a thermometer code such as 0000011 or 0001111, etc. Decoder 122 converts the thermometer code generated by comparators 14 to a binary output of N bits. A clock may be used to hold the digital output and synchronize it for reading by a following stage. The clock could be applied to comparators 14 if latched-output comparators were substituted. The clock may not be used in some embodiments.

Figure 6:
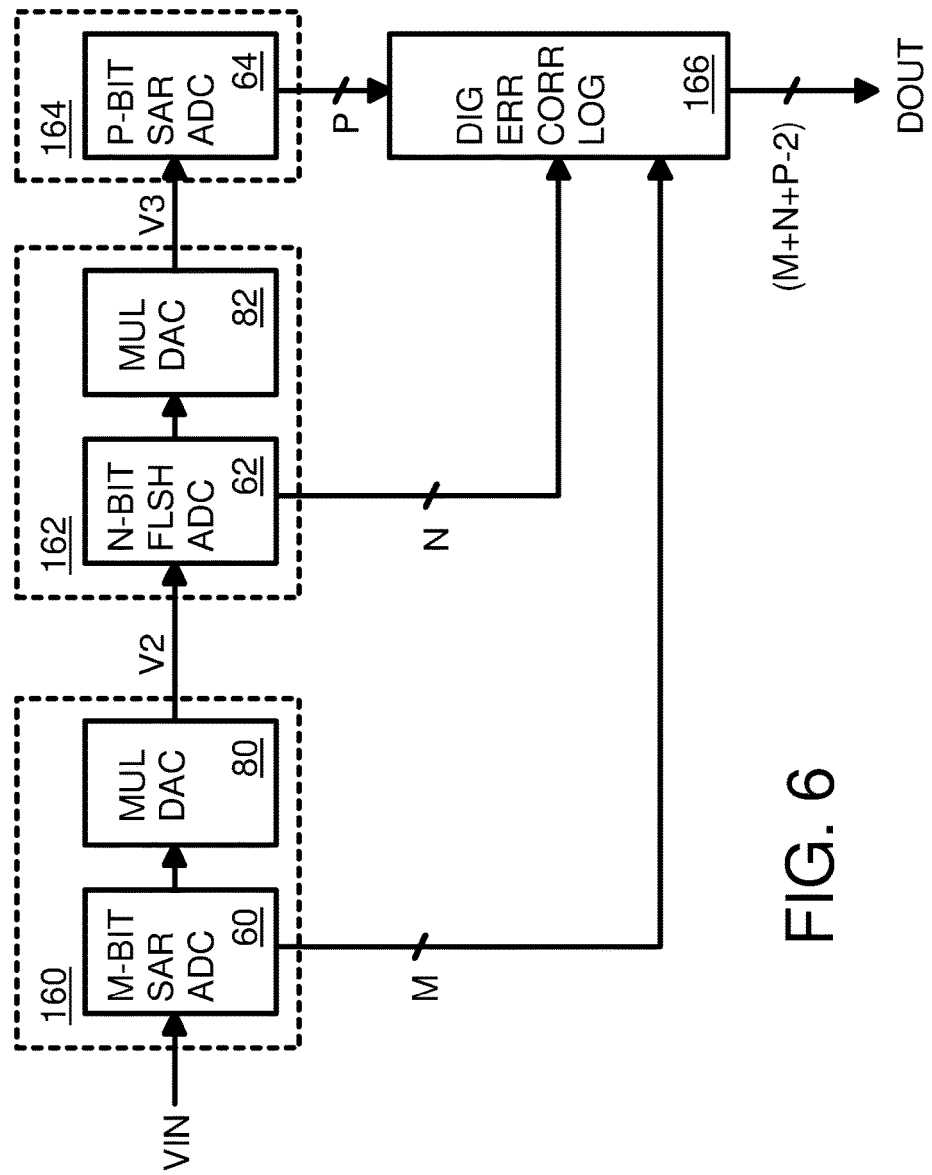
FIG. 6 is a simplified diagram of a multi-stage hybrid ADC with both flash and SAR stages.

FIG. 6 is a simplified diagram of a multi-stage hybrid ADC with both flash and SAR stages. Three stages 160, 162, 164, are used to provide a high resolution, such as 14 bits. SAR first stage 160 includes M-bit SAR ADC 60 that converts input analog voltage VIN into M binary bits over several clock cycles. Multiplying DAC 80 re-converts the M bits to an analog voltage that is subtracted from VIN and then this difference is amplified to get V2.

Flash second stage 162 uses N-bit flash ADC 62 to quickly convert the analog voltage V2 output from SAR first stage 160. Flash second stage 162 includes N-bit flash ADC 62 that converts analog voltage V2 into N binary bits in less than one clock cycle. Multiplying DAC 82 re-converts the N bits to an analog voltage that is subtracted from V2 and then this difference is amplified to get V3.

SAR final stage 164 includes SAR ADC 64 that generates a final set of P digital bits over several successive clock cycles. The M, N, and P bits are sent to digital error correction logic 166 which orders these binary bits and removes redundancies. The final data output DOUT has M+N+P−2 binary bits.

Figure 7:
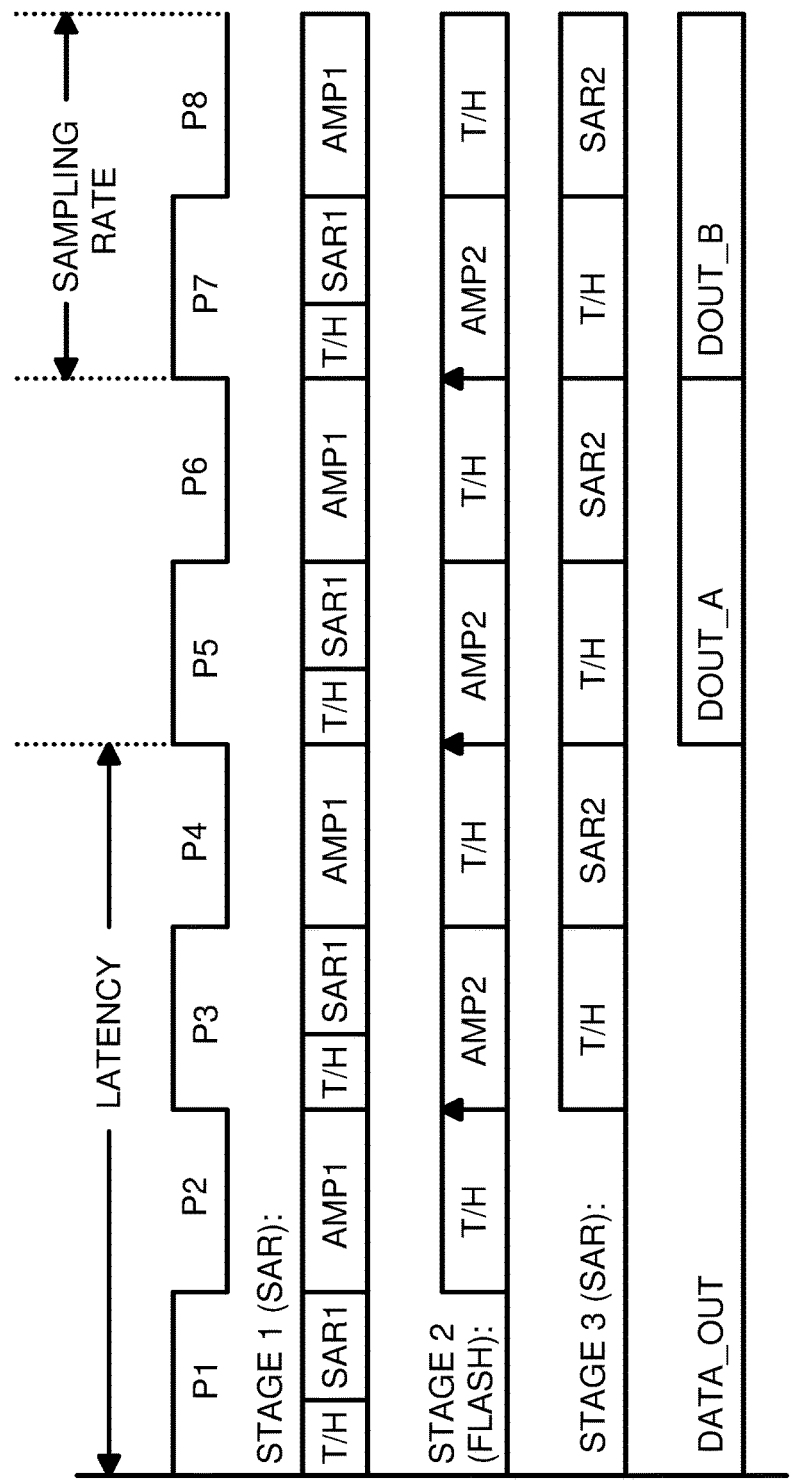
FIG. 7 is a timing diagram of operation of the multi-stage hybrid ADC with both flash and SAR stages of FIG. 6.

FIG. 7 is a timing diagram of operation of the multi-stage hybrid ADC with both flash and SAR stages of FIG. 6. The internal CLK used to time cycles in SAR ADC 60, 64 can be divided down to generate a pipeline clock that delineates phases P1, P2, P3, etc. in FIG. 7.

During phase P1, SAR ADC 60 in SAR first stage 160 tracks and holds (T/H) analog input VIN, then over multiple CLK (not shown) cycles successively converts VIN to the M binary MSB bits, shown as SAR1 in clock phase P1. Then in phase P2 multiplying DAC 80 amplifies the residual voltage to generate V2, shown by operation AMP1 in phase P2 for stage 1. At this same time in P2, flash second stage 162 is tracking and holding V2 such as by sampling into a capacitor array in DAC 72. Residual amplification requires time to settle, especially for smaller voltage differences, so the amplified residual voltage V2 is initially unstable and incorrect at the beginning of phase P2, but settles down to the correct value by the end of phase P2. These changes in amplified voltage V2 flow through flash ADC 62.

At the end of phase P2, V2 is correct and stable, and the last changes flow through SAR ADC 64 as the pipeline clock rises between phases P2 and P3. Then in flash second stage 162 multiplying DAC 82 generates the residual voltage and amplifies it (AMP2) to generate V3. SAR final stage 164 tracks voltage V3 until the end of phase P3, when the final stable V3 is sampled into SAR ADC 64 in SAR final stage 164. Then during phase P4 SAR ADC 64 converts V3 to P binary bits over several CLK cycles that occur during P4. At the end of phase P4, SAR ADC 64 outputs the final P bits to digital error correction logic 166, which performs error correction and outputs DOUT during P5 or at the beginning of P5 when digital error correction logic 166 operates at the end of SAR2.

The latency from VIN to DOUT is four phases of the pipeline clock, P1, P2, P3, P4. An analog voltage VIN that is sampled in P1 is converted by SAR1 in P1, then its residual amplified in P2 (AMP1), and immediately converted by flash ADC 62 at the beginning of P3 (up arrow), allowing the rest of P3 to be used to amplify the second residual voltage in flash second stage 162 (AMP2). SAR ADC 64 in SAR final stage 164 converts this final amplified residual (SAR2) during P4, with the final data output being generated in P5.

Since SAR first stage 160, flash second stage 162, and SAR final stage 164 are pipelined, each can be operating on a different data sample at any time. For example, during P3, SAR first stage 160 is sampling a new VIN, while flash second stage 162 is amplifying the residual from the first analog voltage sampled in P1. SAR final stage 164 is tracking the output V3 from flash second stage 162, waiting to perform conversion SAR1 in the next phase P4.

During P6, SAR first stage 160 is amplifying the residual from the third analog voltage sampled in P5. Flash second stage 162 is tracking (T/H) output V2 while this amplification AMP1 is occurring. SAR final stage 164 is converting the final amplified residual (SAR2) that was sampled earlier in P3.

The sampling rate is once every cycle of the pipeline clock. The latency is double the sampling rate in this example with three stages. The flash conversion by flash ADC 62 is so fast that it is shown by up arrows in the waveform for stage 2. SAR conversion are much longer, requiring a half clock cycle for SAR2. SAR1 is shorter than SAR2 because fewer MSB's are converted during SAR1 while more LSB's are converted during SAR2 when M is less than P. Also, as the number of bits M, N, P are changed, the time requirements for SAR1, SAR2, AMP1, and AMP2 can change.

Figure 8:
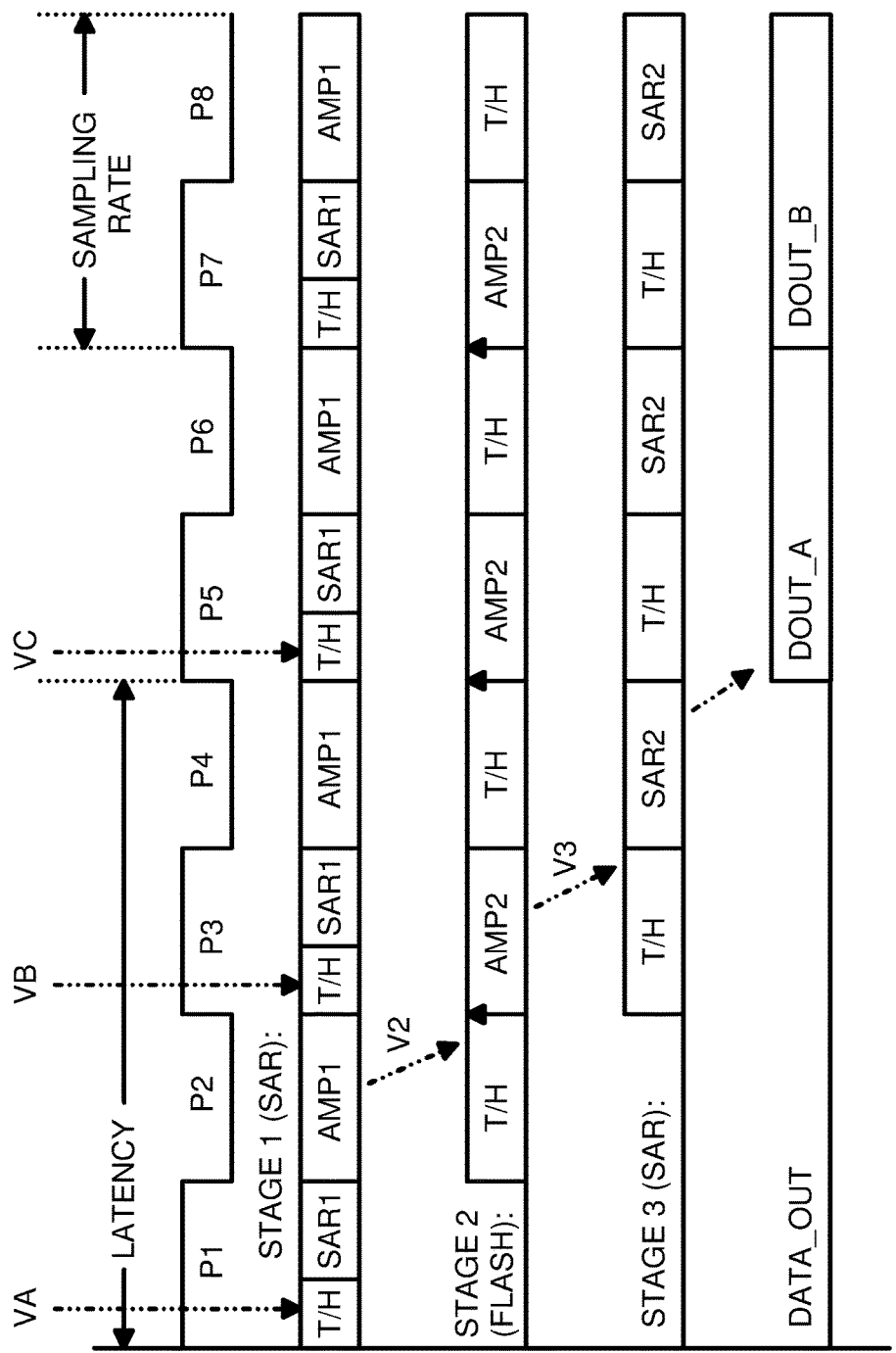
FIG. 8 is a timing diagram showing data flow.

FIG. 8 is a timing diagram showing data flow. The input analog voltage VIN is sampled during P1 as VA, during P3 as VB, and during P5 as VC. These voltages are tracked and held (T/H) and then converted (SAR1) by SAR ADC 60 in SAR first stage 160 in the same phase when sampling occurs. In the next phase, the converted digital value is re-converted to analog, subtracted, and amplified (AMP1) to get the first stage's output, V2. This is phase P2 for VA, phase P4 for VB, and phase P6 for VC. Flash second stage 162 is tracking and holding (T/H) V2 using DAC 72 during these phases.

Flash second stage 162 converts the residual voltage V2 at the beginning of phases P3, P5, P7, as shown by the up arrows. Then the converted digital value is re-converted to analog, subtracted, and amplified (AMP2) to get the second stage's output, V3. This is phase P3 for VA, phase P5 for VB, and phase P7 for VC. SAR final stage 164 is tracking and holding (T/H) V3 during these phases using a capacitor array in final SAR ADC 64.

Then SAR ADC 64 in SAR final stage 164 converts V3 (SAR2) during phases P4 for VA, P6 for VB, and P8 for VC. The final data output DOUT is available in phases P5, P6 for VA, and in phases P7, P8 for VB (DOUT_B).

Figure 9:
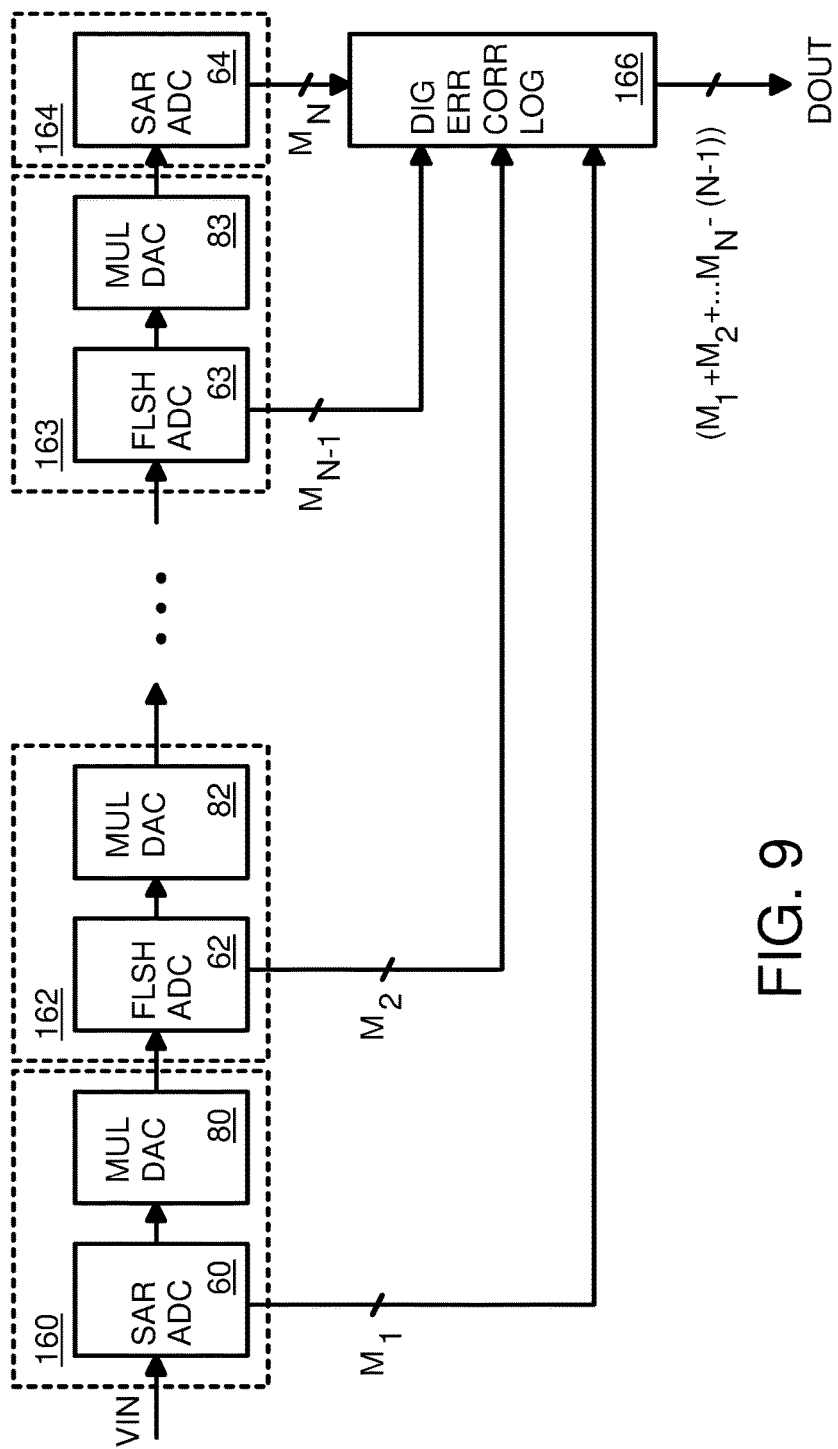
FIG. 9 is a simplified diagram of a larger multi-stage hybrid ADC with both flash and SAR stages.

FIG. 9 is a simplified diagram of a larger multi-stage hybrid ADC with both flash and SAR stages. Multiple stages 160, 162, 163, . . . 164, are used to provide a high resolution, such as 12 or more bits. SAR first stage 160 includes $M_1$-bit SAR ADC 60 that converts input analog voltage VIN into $M_1$ binary bits over several clock cycles. Multiplying DAC 80 re-converts the $M_1$ bits to an analog voltage that is subtracted from VIN and then this difference is amplified to get V2.

Flash second stage 162 uses $M_2$-bit flash ADC 62 to quickly convert the analog voltage V2 output from SAR first stage 160. Flash second stage 162 includes $M_2$-bit flash ADC 62 that converts analog voltage V2 into $M_2$ binary bits in less than one clock cycle. Multiplying DAC 82 re-converts the $M_2$ bits to an analog voltage that is subtracted from V2 and then this difference is amplified to get V3.

Other flash stages 163 each use an X-bit flash ADC 63 to convert X binary bits, where X is $M_3, M_4, \ldots M_{N-1}$, where N is the number of stages. Conversion by flash ADC 62 requires less than one clock cycle in each flash stage 163. Multiplying DAC 83 re-converts the Mx bits to an analog voltage that is subtracted from that stage's analog input VX and then this difference is amplified to get the next VX.

SAR final stage 164 includes SAR ADC 64 that generates a final set of $M_N$ digital bits over several successive clock cycles. The $M_1, M_2, M_3, \ldots M_{N-1}$ and $M_N$ bits are sent to digital error correction logic 166, which orders these binary bits and removes redundancies. The final data output DOUT has $(M_1+M_2+M_3+ \ldots M_{N-1}+M_N-(N-1))$ binary bits, wherein N is the number of stages.

Figure 10:
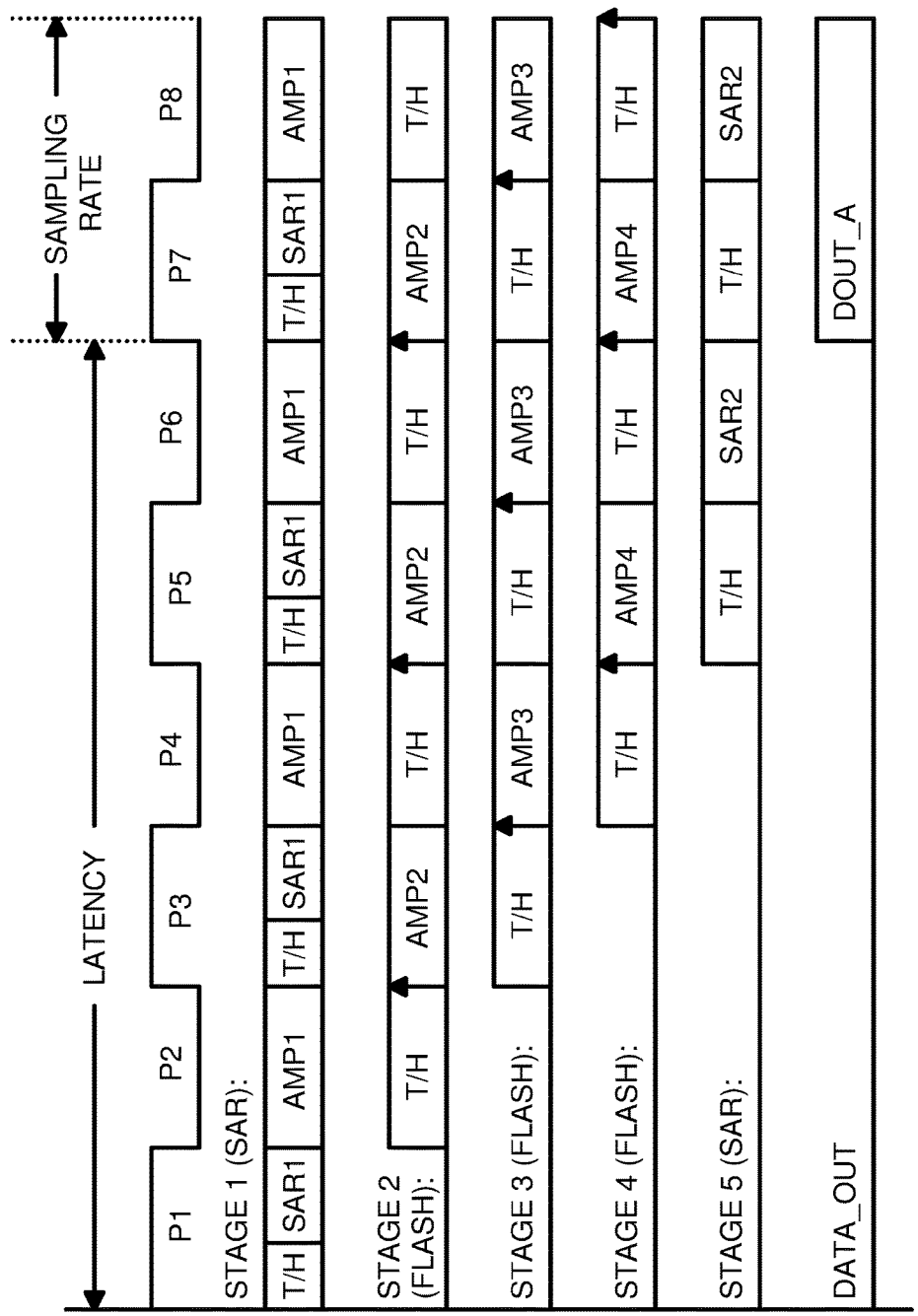
FIG. 10 is a timing diagram for the larger multi-stage hybrid ADC with both flash and SAR stages of FIG. 9.

FIG. 10 is a timing diagram for the larger multi-stage hybrid ADC with both flash and SAR stages of FIG. 9. In this example there are three flash second stages 162, ... 163, that act as middle stages. Each flash middle stage uses one clock phase to track the output from the prior stage, and one clock phase to amplify the residual and drive the amplified analog voltage to the next stage's input. The flash conversion by flash ADC 62 is very quick, and is shown by the up arrow between T/H and AMP2, AMP3, or AMP4.

The final stage, SAR final stage 164, tracks the analog amplified voltage from the last of the flash middle stages (T/H), then uses SAR ADC 64 to convert the last bits (SAR2). Once completed, the converted data bits are output as DOUT_A.

The latency is 6 clock phases of the pipeline clock for this example of 5 stages. In general, for N stages, the latency is N+1.

The sampling rate remains two phases of one cycle of the pipeline clock, regardless of the number of stages. Only the latency is increased as the number of stages in raised.

ALTERNATE EMBODIMENTS

Several other embodiments are contemplated by the inventors. For example the number of stages and the values of M, N, and P can be varied. For example, a 3-stage, 4,4,8 hybrid converter has 4 bits for SAR ADC 60 in stage 1, 4 bits for flash ADC 62 in stage 2, and 8 bit for SAR ADC 64 in the final stage. After removing 2 redundant bits, a 14-bit resolution is provided. When there are multiple flash second stages 162, the number of bits for each of flash second stage 162 can be the same value, or could differ. M may be is 2, 3 or 4 bits, N may be 2 or 3 bits, P may be 4-10 bits, depending on the application and speed, power, size requirements.

SAR ADC 60, flash ADC 62, and SAR ADC 64 may be synchronous to a clock such as CLK, or may operate asynchronously, or semi-synchronous. Each may use there own internal clock, or may use a global clock. A separate sample and hold or track and hold circuit may be used, or the capacitor array in the SAR-ADC may be used to hold the input change, effectively acting as a sample and hold. The pipeline clock may be used by a clock generator to generate internal clocks to the SAR ADC's and the flash ADC. SAR ADC's may be synchronous or asynchronous.

The DAC in the SAR stage could be the same DAC, or use the same capacitor array, as used in the multiplying DAC, or could be a separate DAC.

Clocks and other signals may be gated, disabled, powered-down, buffered, delayed, or otherwise altered. The system may be useful for various applications, such as RF sampling systems, BLE, WIFI, RFID tags, System-on-Chip (SoC) data capturing interfaces such as for memory, video or audio data, and multi-channel time-interleaved ADC. References such as bandgap references may be used to generate reference voltages, and other reference voltages may be used, such as in the DACs. While analog voltage sensing has been described, analog currents may be sensed rather than voltages by passing the analog current through a resistor to develop an analog voltage.

Transistor sizes and ratios could be adjusted to alter voltages that trigger comparison results to be generated, or to adjust logic thresholds to trigger points. Hysteresis could be added.

The nomenclature may be adjusted to refer to the LSB as either bit 0 or bit 1, or some other value. Values may be shifted, transformed, or processed in a variety of ways. The clock may also be an enable signal in some variations. Clocks may be considered to be multi-phase clocks rather than have only two phases per clock period. Non-overlapping clocks and skewed clocks may also be used, and clocks may be divided down and combined in various ways.

Various kinds of ripple counters or synchronous counters could be used in the SAR or elsewhere. Different sequences of test values could be generated by the SAR and applied to generate VDAC for testing bits during conversion. While D-type flip-flops are contemplated for storing digital signals, other storage elements could be substituted, such as J-K flip-flops, S-R latches, D-type latches, bistables, etc. Various clocking schemes could also be used. Analog signals such as analog voltages may be stored as charges on capacitors.

A single-ended or a fully differential ADC may be used. Equalizing switches could be added between true and complementary nodes for reset and equalization. Calibration hardware and routines may be added. ADC's or other logic may be interleaved, and sub-ADC/DAC's may be used or added. Other circuits using switched capacitors may incorporate the invention, such as a switched-capacitor programmable-gain residue amplifier.

The number of bits may be adjusted. For example, a 15 bit hybrid ADC could be used, or an 8-bit, or the 10-bit described. A different number of bits could be substituted for a different precision, and the number of bits could be fixed or could be variable.

Both differential and single-ended analog voltages may be converted. A single-ended analog voltage may be applied to one differential input, while a reference voltage is applied to the other differential input. Sample-and-hold blocks can be a circuit, unit, or network of analog switches, capacitors, op amps, and various combinations. State machines, firmware, software, or hardware may be used to control sequencing such as the test digital values from the SAR.

Some embodiments may not use all components. For example, switches and buffers may be added or deleted in some embodiments. Different kinds of switches may be used, such as 2-way switches or 3-way switches. Muxes may be used as switches. Input resistors could be added to VIN or more complex input filters used. Multiple levels of switches may be used, such as 2-way switches for switches, and then an overall switch that connects either VDD or GND to these 2-way switches.

While binary-weighted conversion has been described, other weightings could be substituted, such as decimally-weighted, prime-weighted, or linearly-weighted, or octal-weighted. The digital value could be in these other number systems, such as octal numbers rather than binary numbers.

Inversions may be added by swapping inverting and non-inverting inputs as desired, but do not change the overall function and thus may be considered equivalents. The resistance and capacitance values may vary in different patterns. Capacitors, resistors, and other filter elements may be added. Switches could be n-channel transistors, p-channel transistors, or transmission gates with parallel n-channel and p-channel transistors, or more complex circuits, either passive or active, amplifying or non-amplifying.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation.

Inversions may be added, or extra buffering. The final sizes of transistors and capacitors may be selected after circuit simulation or field testing. Metal-mask options or other programmable components may be used to select the final capacitor, resistor, or transistor sizes. Capacitors may be connected together in parallel to create larger capacitors that have the same fringing or perimeter effects across several capacitor sizes.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A hybrid flash and Successive-Approximation Register (SAR) Analog-to-Digital Converter (ADC) comprising:
    an analog input receiving an analog input;
    a SAR first stage that comprises:
        an M-bit SAR ADC that converts the analog input into M binary bits by performing a sequence of tests of successive values of the M binary bits until a closest match of an analog representation of the M binary bits with the analog input is found;
        an M-bit multiplying Digital-to-Analog Converter (DAC) that converts the M binary bits from the M-bit SAR ADC into a first re-converted analog signal that is subtracted from the analog input and amplified to generate a first amplified analog signal;
    one or more flash middle stages that receives the first amplified analog signal as a stage analog input to a first flash middle stage and generates a final amplified analog signal from a stage amplified output of a last flash middle stage, wherein the stage amplified output from a prior flash middle stage is connected to the stage analog input of a next flash middle stage for adjacent flash middle stages;
    wherein each flash middle stage comprises:
        a Q-bit flash ADC that converts the stage analog input into Q binary bits by performing a plurality of $2^Q-1$ comparisons using a plurality of $2^Q-1$ comparators in parallel to compare the stage analog input to a series of analog reference values to generate a plurality of comparator outputs that are decoded into the Q binary bits;
        a Q-bit multiplying DAC that converts the Q binary bits from the Q-bit flash ADC into a second re-converted analog signal that is subtracted from the stage analog input and amplified to generate the stage amplified output; and
    a SAR final stage that comprises:
        a P-bit SAR ADC that converts the final amplified analog signal into P binary bits by performing a sequence of tests of successive values of the P binary bits until a closest match of an analog representation of the P binary bits with the final amplified analog signal is found;
    wherein M, Q, and P are whole numbers of at least 2.

2. The hybrid flash and SAR ADC of claim 1 further comprising:
    an digital error correction logic that receives and combines the M binary bits generated by the M-bit SAR ADC in the SAR first stage, the Q binary bits generated by each of the one or more flash middle stages, and the P binary bits generated by the SAR final stage to generate a final digital output of binary bits that are a digital representation of the analog input.

3. The hybrid flash and SAR ADC of claim 2 wherein the digital error correction logic further comprises a redundant bit remover that collapses pairs of redundant bits from adjacent stages into a single binary bit;
    wherein a redundant binary bit is removed for each pair of adjacent stages.

4. The hybrid flash and SAR ADC of claim 3 further comprising:
    wherein the flash middle stages altogether generate Q*N binary bits, wherein N is a number of flash middle stages, wherein N is a whole number of at least 1;
    wherein the digital error correction logic outputs M+Q*N+P−(N−1) binary bits as the final digital output.

5. The hybrid flash and SAR ADC of claim 1 wherein the analog signals are analog voltages.

6. The hybrid flash and SAR ADC of claim 1 wherein the M-bit multiplying DAC further comprises:

a first M-bit DAC that converts the M binary bits from the M-bit SAR ADC into the first re-converted analog signal;

a first subtractor that subtracts the first re-converted analog signal from the analog input to generate a first difference signal;

a first residual amplifier that receives the first difference signal and generates the first amplified analog signal;

wherein the Q-bit multiplying DAC further comprises:
a second Q-bit DAC that converts the Q binary bits from the Q-bit flash ADC into a second re-converted analog signal;

a second subtractor that subtracts the second re-converted analog signal from the stage analog input to generate a second difference signal;

a second residual amplifier that receives the second difference signal and generates the stage amplified output.

7. The hybrid flash and SAR ADC of claim 6 wherein the first M-bit DAC is also a DAC used by the M-bit SAR ADC.

8. The hybrid flash and SAR ADC of claim 6 further comprising:
a pipeline clock that controls timing of operations within the hybrid flash and SAR ADC;

wherein the M binary bits are generated by the M-bit SAR ADC during a first phase of the pipeline clock and amplified by the first residual amplifier during a second phase of the pipeline clock;

wherein the Q binary bits are both generated by the Q-bit flash ADC and amplified by the second residual amplifier during a third phase of the pipeline clock;

wherein when N is 1, the P binary bits are generated by the P-bit SAR ADC during a fourth phase of the pipeline clock immediately after the third phase;

wherein the M, Q, and P binary bit are generated in four phases of the pipeline clock when N is 1;

wherein when N is greater than 1, additional groups of Q binary bits are both generated by the Q-bit flash ADC and amplified by the second residual amplifier during each extra phase after the third phase of the pipeline clock;

wherein when N is greater than 1, the P binary bits are generated by the P-bit SAR ADC during a last phase of the pipeline clock immediately after a last of the extra phases;

wherein the M, Q, and P binary bit are generated in N+1 phases of the pipeline clock when N is greater than 1;

wherein N is a number of flash middle stages, wherein N is a whole number of at least one.

9. A three-stage pipelined hybrid Analog-to-Digital Converter (ADC) comprising:
an analog input for receiving an input analog signal for conversion to a digital value of binary bits that represents the input analog signal;

a Successive-Approximation Register (SAR) first stage that receives the input analog signal on the analog input, the SAR first stage comprising;
a first SAR ADC for successively generating Most-Significant-Bits (MSBs) of the digital value of binary bits from the input analog signal;
a first multiplying Digital-to-Analog Converter (DAC), the first multiplying DAC re-converting the MSBs of the digital value of binary bits to a first converted analog signal, subtracting the first converted analog signal from the input analog signal to generate a first difference signal, and amplifying the first difference signal to generate a first amplified analog signal;

a flash second stage that receives the first amplified analog signal, the flash second stage comprising:
a flash ADC that uses parallel comparators to simultaneously compare the first amplified analog signal to a series of reference voltages to generate middle bits of the digital value of binary bits that represents the input analog signal;
a second multiplying DAC for re-converting the middle bits of the digital value of binary bits to a second converted analog signal, for subtracting the second converted analog signal from the first amplified analog signal to generate a second difference signal, and for amplifying the second difference signal to generate a second amplified analog signal;

a SAR final stage that receives the second amplified analog signal, the SAR final stage comprising:
a final SAR ADC for successively generating Least-Significant-Bits (LSBs) of the digital value of binary bits from the input analog signal by successively converting the second amplified analog signal;

digital error correction logic that combines the MSBs generated by the SAR first stage, the middle bits generated by the flash second stage, and the LSBs generated by the SAR final stage to generate the digital value of binary bits that represents the input analog signal; and a digital output from the digital error correction logic, the digital output outputting the digital value of binary bits that represents the input analog signal;

whereby SAR ADCs generate the MSBs and the LSBs of the digital value of binary bits that represents the input analog signal, while the flash ADC generates the middle bits of the digital value of binary bits that represents the input analog signal.

10. The three-stage pipelined hybrid ADC of claim 9 wherein the digital error correction logic removes a redundant bit between stages by combining a least-significant bit of the MSBs and a most-significant bit of the middle bits into a single bit in the digital output;

wherein the digital error correction logic further removes a second redundant bit between stages by combining a least-significant bit of the middle bits and a most-significant bit of the LSBs into a single bit in the digital output, whereby the digital error correction logic removes redundant bits between stages.

11. The three-stage pipelined hybrid ADC of claim 9 wherein the flash ADC further comprises:
a voltage divider that is a series of resistors connected in series between a supply reference voltage and a supply voltage, wherein nodes between resistors in the series of resistors generate the series of reference voltages;

a plurality of comparators, each comparator receiving the first amplified analog signal and a different one of the series of reference voltages, wherein the plurality of comparators together generate a thermometer-code output;

a decoder that receives the thermometer-code output from the plurality of comparators and generates a binary output that is a binary-code equivalent of a thermometer code on the thermometer-code output.

12. The three-stage pipelined hybrid ADC of claim 11 wherein the plurality of comparators comprises at least 8 comparators;
wherein the flash ADC generates the middle bits that have at least 3 binary bits.

13. The three-stage pipelined hybrid ADC of claim 12
wherein the first SAR ADC generates at least 4 binary bits;
wherein the flash ADC generates at least 3 binary bits;
wherein the final SAR ADC generates at least 7 binary bits;
wherein the digital output has at least 12 binary bits of resolution to represent the input analog signal.

14. The three-stage pipelined hybrid ADC of claim 9 further comprising:
a pipeline clock that defines a series of pipeline-clock phases;
wherein the first SAR ADC of the SAR first stage converts the analog input signal into the MSBs during a first phase of the pipeline clock;
wherein the first multiplying DAC generates the first amplified analog signal from the MSBs during a second phase of the pipeline clock;
wherein the flash ADC converts the first amplified analog signal into the middle bits at a start of a third phase of the pipeline clock, and the second multiplying DAC generates the second amplified analog signal from the middle bits during the third phase of the pipeline clock;
wherein the final SAR ADC converts the second amplified analog signal into the LSBs during a fourth phase of the pipeline clock, and the digital error correction logic combines the MSBs, the middle bits, and the LSBs to generate the digital value of binary bits that represents the analog input signal during the fourth phase of the pipeline clock;
wherein all binary bits are converted during four phases of the pipeline clock.

15. The three-stage pipelined hybrid ADC of claim 9 wherein the first multiplying DAC further comprises:
a first DAC that receives the MSBs from the first SAR ADC and generates the first converted analog signal;
a first subtractor, receiving the first converted analog signal and the analog input signal, for subtracting the first converted analog signal from the analog input signal to generate the first difference signal;
a first residual amplifier, receiving the first difference signal, for amplifying the first difference signal to generate the first amplified analog signal,
wherein the first amplified analog signal is larger than the first difference signal;
wherein the second multiplying DAC further comprises:
a second DAC that receives the middle bits from the flash ADC and generates the second converted analog signal;
a second subtractor, receiving the second converted analog signal and the first amplified analog signal, for subtracting the second converted analog signal from the first amplified analog signal to generate the second difference signal; and
a second residual amplifier, receiving the second difference signal, for amplifying the second difference signal to generate the second amplified analog signal,
wherein the second amplified analog signal is larger than the second difference signal.

16. The three-stage pipelined hybrid ADC of claim 15 wherein the first SAR ADC comprises:
a first sample-and-hold circuit for sampling the analog input signal to generate a first sampled signal;
a first Successive-Approximation Register (SAR) for storing and adjusting a first digital test value;
a first Digital-to-Analog Converter (DAC) that receives a first sequence of the first digital test value from the first SAR and generates a first DAC analog signal represented by the first digital test value;
a first comparator that compares the first DAC analog signal to the first sampled signal to generate a first compare result;
an end of conversion signal generated when the first sequence of the first digital test value from the first SAR has completed.

17. The three-stage pipelined hybrid ADC of claim 16 wherein the final SAR ADC comprises:
a second sample-and-hold circuit for sampling the second amplified analog signal to generate a second sampled signal;
a second SAR for storing and adjusting a second digital test value;
a second DAC that receives a second sequence of the second digital test value from the second SAR and generates a second DAC analog signal represented by the second digital test value;
a second comparator that compares the second DAC analog signal to the second sampled signal to generate a second compare result;
an end of conversion signal generated when the second sequence of the second digital test value from the second SAR has completed.

18. An Analog-to-Digital Converter (ADC) comprising:
an analog input for receiving an analog input signal;
a first Successive-Approximation Register (SAR) ADC that converts the analog input signal into M binary bits by performing a sequence of tests of successive values of the M binary bits until a closest match of an analog representation of the M binary bits with the analog input signal is determined;
a first Digital-to-Analog Converter (DAC) that converts the M binary bits from the first SAR ADC into a first converted analog signal;
a first analog subtractor that subtracts the first converted analog signal from the analog input signal to generate a first analog difference signal;
a first residual amplifier that amplifies the first analog difference signal to generate a first amplified analog signal;
a flash ADC that converts the first amplified analog signal into Q binary bits by performing a plurality of $2^Q-1$ comparisons using a plurality of $2^Q-1$ comparators in parallel to compare the first amplified analog signal to a series of analog reference values to generate a plurality of comparator outputs;
a decoder that decodes the plurality of comparator outputs from a thermometer code into the Q binary bits represented by a binary code;
a second DAC that converts the Q binary bits from the flash ADC into a second converted analog signal;
a second analog subtractor that subtracts the second converted analog signal from the first amplified analog signal to generate a second analog difference signal;
a second residual amplifier that amplifies the second analog difference signal to generate a second amplified analog signal;
a final SAR ADC that converts the second amplified analog signal into P binary bits by performing a sequence of tests of successive values of the P binary bits until a closest match of an analog representation of the P binary bits with the second amplified analog signal is found;
wherein M, Q, and P are whole numbers of at least three.

19. The ADC of claim 18 further comprising:
digital error correction logic means, that receives and combines the M binary bits generated by the first SAR ADC, the Q binary bits generated by the flash ADC, and the P binary bits generated by the final SAR ADC, for generating a final digital output of binary bits that are a digital representation of the analog input signal;

redundant bit remover means for removing redundant bits when combining the M, Q, and P binary bits;

wherein the digital error correction logic means outputs M+Q+P−2 binary bits as the final digital output.

20. The ADC of claim 19 further comprising:

a pipeline clock that controls timing of operations within the ADC;

wherein the M binary bits are generated by the first SAR ADC during a first phase of the pipeline clock and amplified by the first residual amplifier during a second phase of the pipeline clock;

wherein the Q binary bits are both generated by the flash ADC and amplified by the second residual amplifier during a third phase of the pipeline clock;

wherein the P binary bits are generated by the final SAR ADC during a fourth phase of the pipeline clock immediately after the third phase;

wherein the M, Q, and P binary bit are generated in four phases of the pipeline clock.

* * * * *